United States Patent [19]

Malko

[11] Patent Number: 4,617,936

[45] Date of Patent: Oct. 21, 1986

[54] FLEXIBLE SURFACE COIL FOR MAGNETIC RESONANCE IMAGING

[75] Inventor: John A. Malko, Dunwoody, Ga.

[73] Assignee: North American Philips Corporation, New York, N.Y.

[21] Appl. No.: 763,724

[22] Filed: Aug. 8, 1985

[51] Int. Cl.[4] .................................................. A61B 5/05
[52] U.S. Cl. ..................................... 128/653; 324/309
[58] Field of Search ............... 128/653, 721, 804, 1.3, 128/1.5; 324/309, 311, 318; 343/700 R, 741, 743, 744, 895

[56] References Cited

U.S. PATENT DOCUMENTS

| | | | |
|---|---|---|---|
| 2,142,117 | 1/1939 | Dow | 343/700 |
| 3,268,845 | 8/1966 | Whitmore | 128/721 X |
| 3,290,521 | 12/1966 | Coleman et al. | 128/721 X |

FOREIGN PATENT DOCUMENTS 1284673 2/1972 United Kingdom ............... 128/704

OTHER PUBLICATIONS

"Application of Surface Coils in MR Imaging", Boskamp, Medicamundi V29, No. 2, 1984.
"Nuclear Magnetic Resonance and its Application to Living Systems", Gadian, Claredon Press (1982) Chapter 8.

Primary Examiner—Kyle L. Howell
Assistant Examiner—Francis J. Jaworski
Attorney, Agent, or Firm—Jack E. Haken

[57] ABSTRACT

A surface coil for use with magnetic resonance imaging apparatus comprises an electrically-insulating, flexible tube which is filled with a liquid mercury conductor.

7 Claims, 2 Drawing Figures

FLEXIBLE SURFACE COIL FOR MAGNETIC RESONANCE IMAGING

FIELD OF THE INVENTION

The invention relates to apparatus for forming images of internal body structures using nuclear magnetic resonance phenomena. The invention is particularly useful for producing diagnostic images of local volumes within a human body.

BACKGROUND OF THE INVENTION

Apparatus which uses nuclear magnetic resonance (NMR) phenomena to measure and produce images of the distribution of physical properties in body tissue is well known and is described, for example, in the article *Proton NMR Tomography*, P. R. Locher, Philips Technical Review, Volume 41, 1983/84, No. 3 at page 73. This apparatus usually includes a magnet system for generating a large, homogeneous magnetic field in conjunction with a plurality of smaller gradient magnetic fields, means for generating a homogeneous radio frequency alternating magnetic field which excites nuclear magnetic resonance phenomena within the body, and means for detecting magnetic resonance signals which are generated within the tissues being examined. This apparatus allows simultaneous measurement of the properties at many points within a region of the body.

In such apparatus, it has become common to use a first large coil to generate the exciting radio frequency magnetic field and a second, smaller coil, often called a "surface coil," to detect resonance signals in a localized volume of the body which is undergoing examination. Apparatus of this type is described in Computer Tomography, 1, 1981, pp. 2–10 and at chapter 8, page 164 of the book *Nuclear Magnetic Resonance and its Applications to Living Systems*, D. G. Gadian, Clarendon Press Oxford. (1982) which describes the advantages of using surface coils for bloodstream measurements. Surface coils are said to achieve high detection signals-to-noise ratios and to make accurate measurements in relatively small regions near the coil, since it is possible to adapt the shape and size of the coil to the shape and size of the object being measured. In such systems, the radio frequency electromagnetic coil is usually a larger coil, often called a "body coil", in order to achieve sufficient spatial homogeneity of the magnetic field.

Direct electromagnetic coupling between a surface coil and the body coil can degrade performance of a magnetic resonance imaging system, particularly when the body coil and surface coil are not disposed in perpendicular planes. U.S. patent application Ser. No. 677,939 (filed Dec. 4, 1984 by E. Boskamp et al) describes apparatus which electrically decouples a surface coil from a body coil. In one embodiment of this apparatus, an electrically-variable capacitor is used to detune the surface coil by raising its resonant frequency above the nominal signal frequency whenever the body coil is activated. This system is also described in the article *Application of Surface Coils in MR Imaging* by E. Boskamp in Medicamundi, Vol. 29, No. 2, 1984. The above-mentioned publications are incorporated herein, by reference, as background material.

Prior art surface coils have generally been constructed from relatively rigid copper wire. Single-turn surface coils were preferred at the frequencies which are used in present-day magnetic resonance imaging systems. It is known that surface coils should be constructed from materials which are free of paramagnetic impurities. Copper coils have, therefore, been used in preference to silver coils, even though silver has better electrical conductivity properties than does copper.

SUMMARY OF THE INVENTION

In accordance with the invention, a surface coil for nuclear magnetic resonance imaging apparatus comprises one or more turns of a flexible electrically-insulating tube which is filled with an electrically-conductive liquid. In a preferred embodiment, the surface coil comprises a single turn of flexible plastic tubing which is filled with high purity mercury. The flexible coil is able to closely conform with body surface contours and potentially allows more accurate imaging and greater patient comfort than did the substantially rigid surface coils of the prior art.

THE DRAWINGS

In the drawings which follow:

FIG. 1 schematically represents a magnetic resonance imaging system which utilizes a surface coil; and FIG. 2 illustrates a surface coil of the present invention.

DESCRIPTION OF A PREFERRED EMBODIMENT

Figure 1:
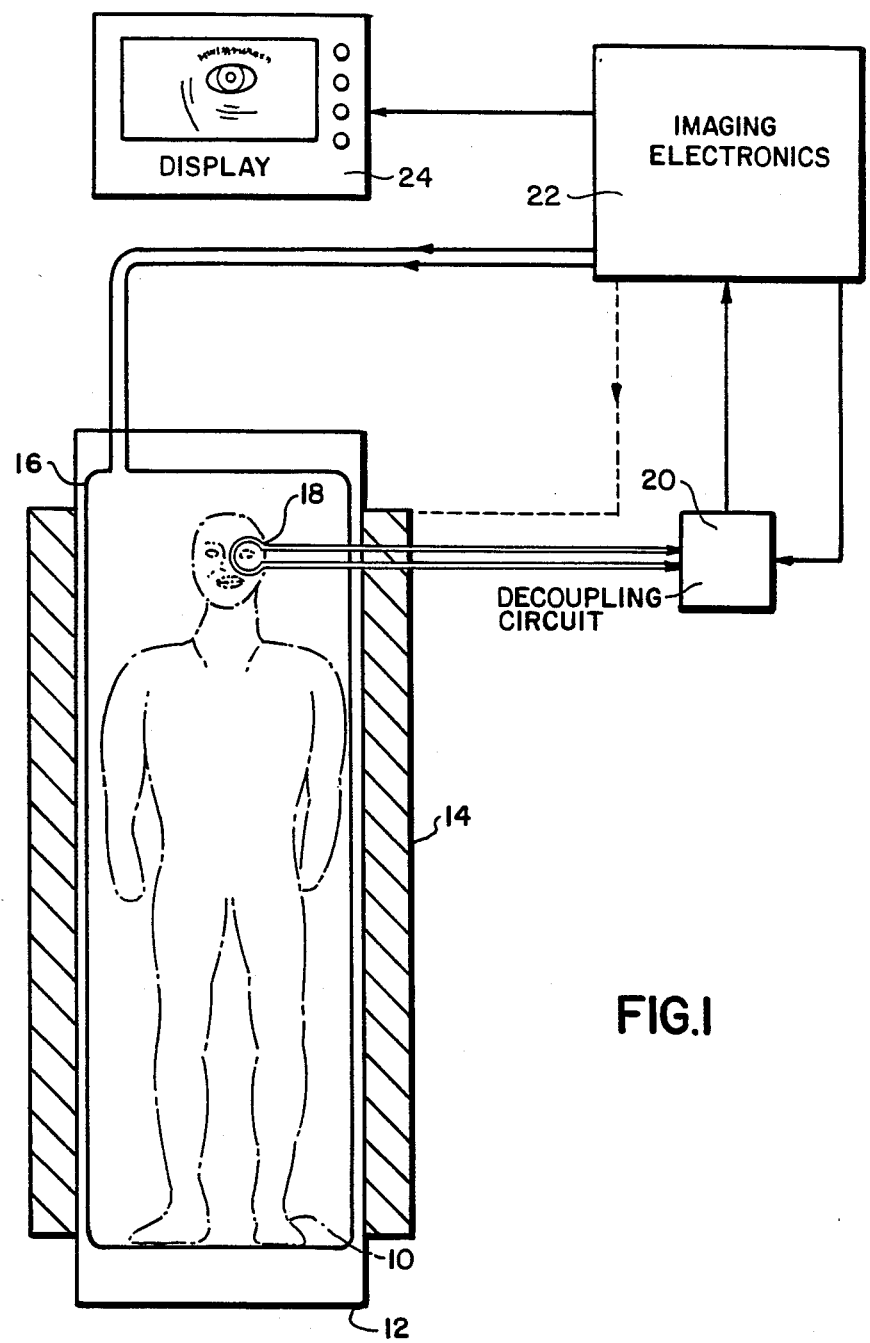

FIG. 1 schematically illustrates a magnetic resonance imaging system which utilizes a surface coil of the present invention. A patient undergoing examination 10 is disposed on an examination table 12 within an examination space. A magnet system 14 surrounds the patient and, in a known manner, provides a high level homogeneous magnetic field together with a plurality of low level spatial gradient fields within a region of the body of the patient undergoing examination. Magnetic resonance phenomena in the body tissues are excited by pulses of radio frequency energy which are applied to a body coil 16 (indicated schematically). The pulses excite body tissues which, in turn, produce radio frequency, magnetic resonance signals. Signals from tissues in a localized volume of the body, for example the facial muscles, are detected by a surface coil 18. The surface coil is connected through a decoupling circuit 20, of the type described in the above-cited Boskamp patent, to imaging electronics 22 of the type well known in the art. The imaging electronics include a digital computer which uses well known algorithms to produce an image of the physical characteristics of the body structures in the region, for example the density of protons in the region. The image may be displayed on a CRT monitor 24.

In accordance with the present invention, the surface coil 18 is a flexible fluid-filled tube which closely conforms to the surface of the local body region. In this configuration, it is unlikely that the surface coil and body coil will at all times lie in mutually perpendicular planes. Use of the decoupling circuit 20 is, therefore, highly desirable in connection with the present invention.

Figure 2:
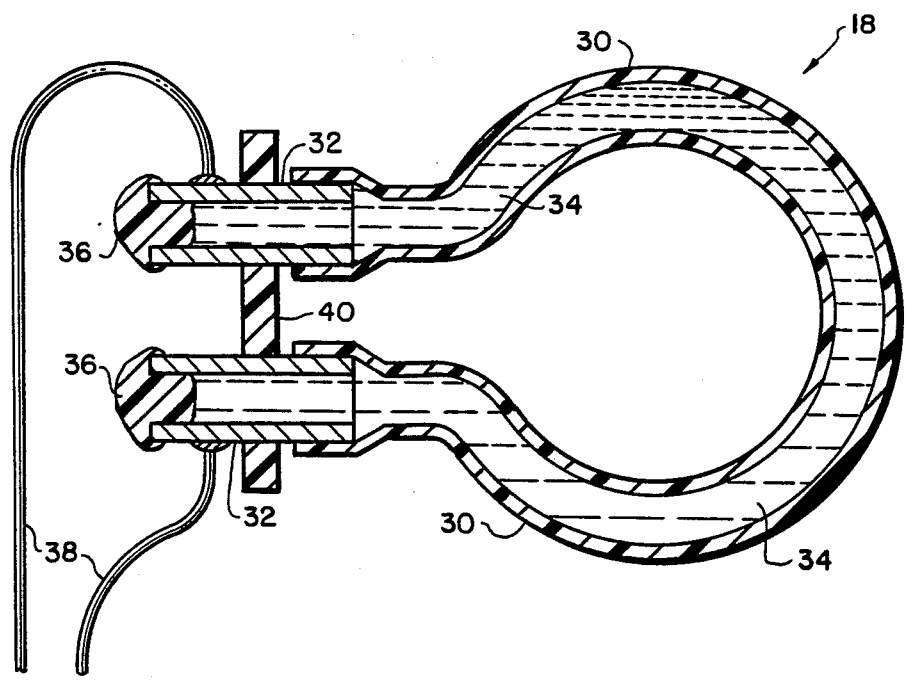

FIG. 2 illustrates details of the surface coil 18. A length of flexible plastic tubing 30 is provided at either end with tubular copper electrodes 32. The tubing and electrodes are filled with a conductive liquid 34. The tubing, conductive liquid and electrodes should be essentially free of paramagnetic impurities. Preferably, the conductive liquid 34 is triple-distilled mercury. The outer ends of the electrodes 32 are plugged, after filling, preferably with an epoxy resin 36. Wires 38 are attached to the electrodes 32 and serve to connect the coil to the decoupling circuit 20 of FIG. 1. The electrodes 32 may be retained in a plastic block 40 to maintain the shape of the tubing coil.

In a preferred embodiment, the flexible tube 30 comprises a synthetic rubber-like material which includes modified halide polymers, condensation resins, and diene derivatives of the type sold under the trademark Tygon. In a first embodiment, the tubing has a 4 mm (5/32 in.) inside diameter and is 33 cm long. In a second embodiment, the tubing 30 is also 4 mm (5/32 in.) in diameter and is 48 cm long. These coils have produced satisfactory images of the facial muscles, lymph nodes, neck and kidneys using a Philips 1.5T Gyroscan, superconducting imager operating at 0.5T (21.347 MHz hydrogen resonance) using a four-measurement multi-slice spin-echo pulse sequence with TR=500 MSec. and TE=30 MSec.

I claim:

1. In magnetic resonance imaging apparatus of the type which includes: magnet means for generating a homogeneous magnetic field and one or more gradient magnetic fields within an examination space: exciting means for generating an alternating magnetic field within the examination space; and surface coils means disposed within the examination space and adapted for placement on the surface of a body undergoing examination for detecting magnetic resonance signals which originate within a localized volume in the body, the improvement wherein:

the surface coil means comprises one or more turns of a flexible, electrically-insulating tube and an electrically-conductive liquid disposed within and filling said tube.

2. The apparatus of claim 1 wherein the surface coil means is a single-turn coil.

3. The apparatus of claim 1 wherein the conductive liquid is mercury.

4. The apparatus of claims 1 or 2 wherein the surface coil means is effectively free of paramagnetic materials.

5. The apparatus of claim 4 wherein the conductive liquid is triple-distilled mercury.

6. The apparatus of claim 5 further comprising copper electrodes disposed in contact with the liquid mercury.

7. The apparatus of claim 1 further comprising decoupling means, connected to the surface coil means, which detune the resonant frequency of the surface coil means at such times as the exciting means is producing an alternating magnetic field in the examination space.

* * * * *